United States Patent
Tu et al.

(10) Patent No.: US 11,424,733 B2
(45) Date of Patent: Aug. 23, 2022

(54) CALIBRATION DEVICE AND CALIBRATION METHOD

(71) Applicant: Realtek Semiconductor Corporation, Hsinchu (TW)

(72) Inventors: Chih-Chan Tu, Hsinchu (TW); Chih-Lung Chen, Hsinchu (TW); Ka-Un Chan, Hsinchu (TW)

(73) Assignee: REALTEK SEMICONDUCTOR CORPORATION, Hsinchu (TW)

( * ) Notice: Subject to any disclaimer, the term of this patent is extended or adjusted under 35 U.S.C. 154(b) by 0 days.

(21) Appl. No.: 17/395,551

(22) Filed: Aug. 6, 2021

(65) Prior Publication Data
US 2022/0149820 A1 May 12, 2022

(30) Foreign Application Priority Data
Nov. 11, 2020 (TW) ................ 109139364

(51) Int. Cl.
*H03H 11/00* (2006.01)
*H03H 11/04* (2006.01)

(52) U.S. Cl.
CPC ..... *H03H 11/04* (2013.01); *H03H 2011/0494* (2013.01)

(58) Field of Classification Search
CPC .................... H03H 11/04; H03H 2022/0494
See application file for complete search history.

(56) References Cited

U.S. PATENT DOCUMENTS

| 7,761,067 B1 | 7/2010 | Tsai et al. | |
| 2006/0245132 A1* | 11/2006 | Watanabe | H03H 11/1291 361/90 |
| 2006/0281431 A1* | 12/2006 | Isaac | H03J 3/32 455/323 |
| 2015/0104031 A1* | 4/2015 | Park | G10K 11/17854 381/71.6 |

FOREIGN PATENT DOCUMENTS

JP 2002290989 A * 10/2002

OTHER PUBLICATIONS

J. Crols et al., "An analog integrated polyphase filter for a high performance low-IF receiver," Symposium on VLSI Circuits Digest of Technical Papers, 1995, pp. 87-88.
Bo Xia, et al., "An RC time constant auto-tuning structure for high linearity continuous-time /spl Sigma//spl Delta/modulators and active filters," IEEE Transactions on Circuits and Systems I: Regular Papers, vol. 51, No. 11, pp. 2179-2188, Nov. 2004.

* cited by examiner

*Primary Examiner* — Dinh T Le
(74) *Attorney, Agent, or Firm* — Locke Lord LLP; Tim Tingkang Xia, Esq.

(57) ABSTRACT

A calibration device includes a signal generator and a processor. The signal generator is configured to provide an input signal to a filter circuit, wherein the filter circuit has a real time constant and is configured to receive the input signal to output an output signal. The processor is configured to calculate a real gain according to the output signal and the input signal, compare the real gain with a target gain to obtain a comparison result and determine whether to adjust the real time constant of the filter circuit according to the comparison result. The present disclosure also provides a calibration method.

18 Claims, 5 Drawing Sheets

CALIBRATION DEVICE AND CALIBRATION METHOD

CROSS-REFERENCE TO RELATED APPLICATION

This application claims priority to Taiwan Application Serial Number 109139364, filed Nov. 11, 2020, which is herein incorporated by reference in its entirety.

BACKGROUND

Field of Invention

This disclosure relates to a calibration device and method, and in particular to a calibration device and method applied to the filter circuit.

Description of Related Art

Generally speaking, the filter is indispensable to the wireless communication system. However, the frequency response of the filter might have a deviation from the originally designed values because of the manufacturing process variation, so as to affect the quality of the demodulation of signals.

For solving the above-described question, a calibration circuit is provided conventionally. The calibration circuit has the same time constant as those of a filter circuit which will be calibrated. The time constant of the calibration circuit would reach a target value by adjusting the capacitance of the capacitor of the calibration circuit. Finally, the capacitance corresponding to the target value is provided for the filter circuit, so as to complete the calibration. However, the above-described method can only compensate the capacitor or the resistor for the deviation caused by the manufacturing process variation, but cannot compensate other components (e.g. operation amplifier) for the deviation caused by the manufacturing process variation. Therefore, it is required to improve the conventional calibration method.

SUMMARY

An aspect of present disclosure relates to a calibration device. The calibration device includes a signal generator and a processor. The signal generator is configured to provide an input signal to a filter circuit, wherein the filter circuit has a real time constant and is configured to receive the input signal to output an output signal. The processor is configured to calculate a real gain according to the output signal and the input signal, compare the real gain with a target gain to obtain a comparison result and determine whether to adjust the real time constant of the filter circuit according to the comparison result.

Another aspect of present disclosure relates to a calibration method. The calibration method includes: providing an input signal to a filter circuit, wherein the filter circuit has a real time constant; receiving an output signal outputted by the filter circuit; calculating a real gain according to the output signal and the input signal; comparing the real gain with a target gain to obtain a comparison result; and determining whether to adjust the real time constant of the filter circuit according to the comparison result.

DETAILED DESCRIPTION

The embodiments are described in detail below with reference to the appended drawings to better understand the aspects of the present disclosure. However, the provided embodiments are not intended to limit the scope of the disclosure, and the description of the structural operation is not intended to limit the order in which they are performed. Any device that has been recombined by components and produces an equivalent function is within the scope covered by the disclosure.

The terms used in the entire specification and the scope of the patent application, unless otherwise specified, generally have the ordinary meaning of each term used in the field, the content disclosed herein, and the particular content.

The terms "coupled" or "connected" as used herein may mean that two or more elements are directly in physical or electrical contact, or are indirectly in physical or electrical contact with each other. It can also mean that two or more elements interact with each other.

Figure 1:
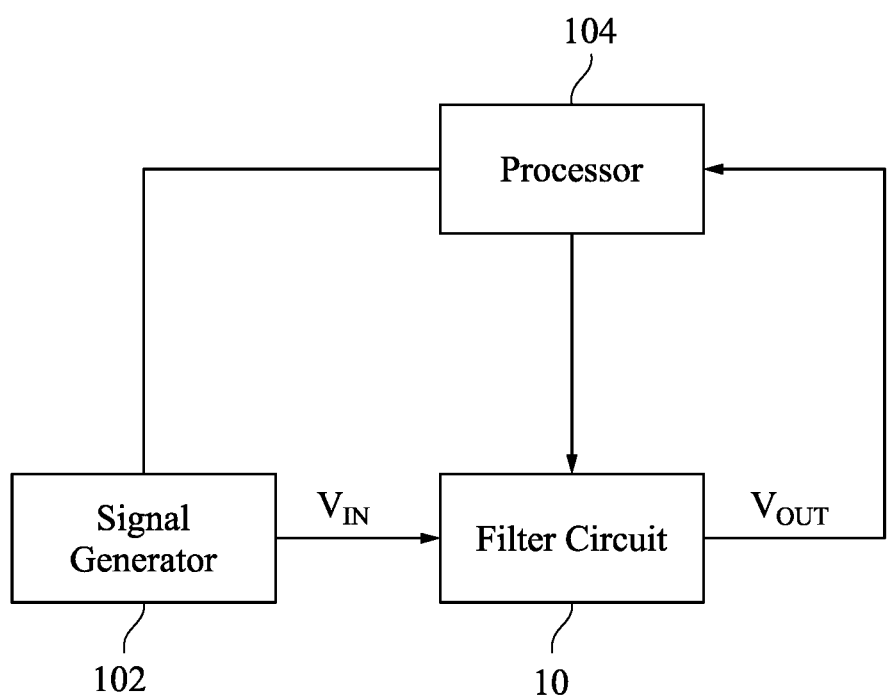
FIG. 1 is a block diagram of a calibration device depicted according to some embodiments of the present disclosure.

Referring to FIG. 1, an embodiment of the present disclosure relates to a calibration device 100. The calibration device 100 includes a signal generator 102 and a processor 104 and is configured to calibrate a filter circuit 10 which is affected by a manufacturing process variation.

In the present embodiment, the filter circuit 10 can be a band-pass filter and is designed to have a predetermined center frequency $f_0$ and a predetermined time constant $\tau_0$ corresponding to the predetermined center frequency $f_0$. However, there is the difference between the time constant of the filter circuit and the originally designed value by the effect of the manufacturing process variation, so that the bandwidth and the center frequency of the filter circuit 10 are also differed from the originally designed values. For example, the filter circuit 10, which is affected by the manufacturing process variation, has a real time constant $\tau_1$ different from the predetermined time constant $\tau_0$ and a real center frequency $f_1$ different from the predetermined center frequency $f_0$.

In structure, the signal generator 102 is coupled to the filter circuit 10. The processor 104 is coupled to the signal generator 102 and the filter circuit 10. In the present embodiment, the signal generator 102 can include a crystal oscillator (not shown) and a low-pass filter (not shown), and the processor 104 can be a central processing unit or a calculator chip.

For better understanding the present application, the operation of the calibration device 100 would be discussed in the following paragraphs with reference made to the accompanying drawings. As shown in FIG. 1, the signal generator 102 provides an input signal $V_{IN}$ to the filter circuit 10 according to a command (not shown) from the processor 104. A frequency of the input signal $V_{IN}$ equals the predetermined center frequency $f_0$, which is originally designed, of the filter circuit 10.

The filter circuit 10 receives the input signal $V_{IN}$, so as to output an output signal $V_{OUT}$ to the processor 104. The processor 104 receives the output signal $V_{OUT}$ and calculates a real gain $gm_r$ according to the output signal $V_{OUT}$ and the input signal $V_{IN}$. Specifically, the processor 104 divides the output signal $V_{OUT}$ by the input signal $V_{IN}$ to generate a ratio and uses the absolute value of the ratio as the real gain $gm_r$.

In the present embodiment, the filter circuit 10 has a target gain $gm_0$ at the predetermined center frequency $f_0$ which is originally designed. It is understood that the target gain gm0 is the maximum gain that the filter circuit 10 should have at the predetermined center frequency $f_0$ which is originally designed. In an example of practical application, the gain that the filter circuit 10 is designed to have at 300 MHz (that is, the predetermined center frequency $f_0$) is 1.5 (that is, the target gain $gm_0$). That is to say, when the frequency of the input signal $V_{IN}$ is 300 MHz, the strength of the output signal $V_{OUT}$ at 300 MHz should be 1.5 times of those of the input signal $V_{IN}$ ideally.

However, the filter circuit 10 which is affected by the manufacturing process variation has the real center frequency $f_1$ different from the predetermined center frequency $f_0$. That is to say, the maximum gain of the filter circuit 10 is altered to be at the real center frequency $f_1$. If the input signal $V_{IN}$ having the predetermined center frequency $f_0$ is inputted to the filter circuit 10, the real gain $gm_r$ calculated by the processor 104 would not be the maximum gain, which is originally designed, of the filter circuit 10. In the above-described example of practical application, the strength of the output signal $V_{OUT}$ at 300 MHz would fail to be 1.5 times of those of the input signal $V_{IN}$. In other words, the real gain $gm_r$ is smaller than 1.5 (that is, the target gain $gm_0$).

After the real gain $gm_r$ is calculated, the processor 104 is configured to compare the real gain $gm_r$ and the target gain $gm_0$, so as to obtain a comparison result. In the ideal condition, the processor 104 obtains a result that the real gain $gm_r$ at the predetermined center frequency f0 equals the target gain $gm_0$ by comparing the real gain $gm_r$ and the target gain $gm_0$. However, if the filter circuit 10 is affected by the manufacturing process variation, the processor 104 would obtain a result that the real gain $gm_r$ at the predetermined center frequency f0 is not equal to the target gain $gm_0$ by comparing the real gain $gm_r$ and the target gain $gm_0$.

Accordingly, the processor 104 is further configured to determine whether to adjust the time constant of the filter circuit 10 according to the comparison result, so as to calibrate the frequency response of the filter circuit 10 to be the originally designed values.

Figure 2A:
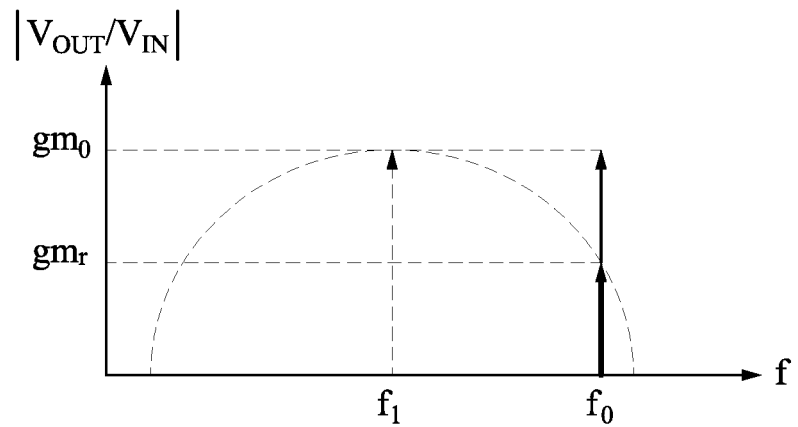
FIG. 2A is a schematic diagram of the frequency response of a filter circuit, which is affected by a manufacturing process variation, depicted according to some embodiments of the present disclosure.

Specifically, referring to FIG. 2A, in the present embodiment, the frequency response (shown as the broken lines) of the filter circuit 10 is affected by the manufacturing process variation, so that the real center frequency $f_1$ is lower than the predetermined center frequency $f_0$. As shown in FIG. 2A, the processor 104 compares the real gain $gm_r$ with the target gain $gm_0$ and obtains the result that the real gain $gm_r$ is smaller than the target gain $gm_0$. In the above-described example of practical application, the real center frequency $f_1$ can be 100 MHz that is lower than 300 MHz, and the real gain $gm_r$ can be 0.75 that is smaller than 1.5. When the real gain $gm_r$ is smaller than the target gain $gm_0$, the processor 104 is configured to adjust the capacitance of at least one capacitor (not shown) of the filter circuit 10 (or the resistance of at least one resistor (not shown) of the filter circuit 10) to adjust the real time constant $\tau_1$ of the filter circuit 10, so as to change the real center frequency $f_1$ and the real gain $gm_r$ of the filter circuit 10.

After multiple comparisons and adjustments, the real gain $gm_r$ would gradually approach the target gain $gm_0$. For example, the processor 104 can digitally adjust the capacitance of the at least one capacitor from 64 farads to 32, 16, 8 and 4 farads in order. As the capacitance of the at least one capacitor is gradually decreased, the real center frequency $f_1$ and the real gain $gm_r$ of the filter circuit 10 are gradually increased. In the above-described example of practical application, as the capacitance of the at least one capacitor is gradually decreased, the real center frequency $f_1$ can be gradually increased from 100 MHz to 300 MHz, and the real gain $gm_r$ at the predetermined center frequency $f_0$ can be gradually increased from 0.75 to 1.5.

Figure 2B:
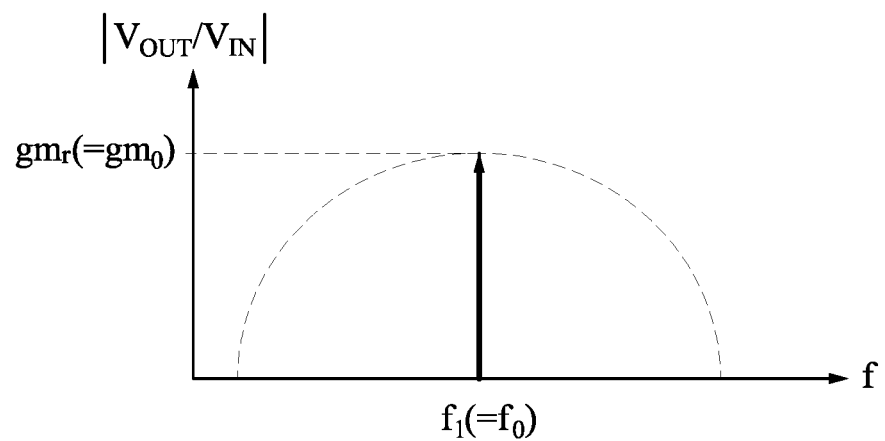
FIG. 2B is a schematic diagram of the frequency response of the filter circuit, which is affected by a manufacturing process variation, after calibration depicted according to some embodiments of the present disclosure.

Referring to FIG. 2B then, when the processor 104 compares the real gain $gm_r$ with the target gain $gm_0$ and obtains the result that the real gain $gm_r$ equals the target gain $gm_0$, the processor 104 no longer adjusts the real time constant $\tau_1$ of the filter circuit 10. The real time constant $\tau_1$ and the real center frequency $f_1$ of the filter circuit 10 being calibrated would equal the predetermined time constant $\tau_0$ and the predetermined center frequency $f_0$ which are originally designed. In the above-described example of practical application, after the filter circuit 10 is calibrated, the real center frequency $f_1$ can be 300 MHz, and the real gain $gm_r$ at the predetermined center frequency $f_0$ can be 1.5. It is worth noting that the capacitance of the at least one capacitor has the value that is required for the filter circuit 10 affected by the manufacturing process variation.

Figure 3:
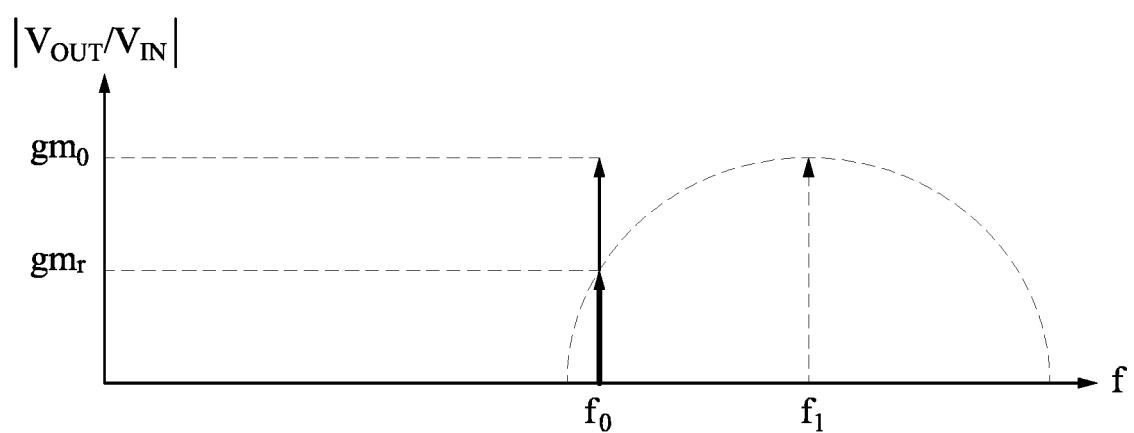
FIG. 3 is a schematic diagram of the frequency response of another filter circuit, which is affected by a manufacturing process variation, depicted according to some embodiments of the present disclosure.

Referring to FIG. 3, in other some embodiments, the frequency response (shown as the broken lines) of the filter circuit 10 is affected by the manufacturing process variation, so that the real center frequency $f_1$ is higher than the predetermined center frequency $f_0$. The processor 104 compares the real gain $gm_r$ with the target gain $gm_0$ and still obtains the result that the real gain $gm_r$ is smaller than the target gain $gm_0$. In the above-described example of practical application, the real center frequency $f_1$ can be 500 MHz that is higher than 300 MHz, and the real gain $gm_r$ can be 0.75 that is smaller than 1.5. Similarly, the processor 104 can digitally and gradually increase the capacitance of the at least one capacitor (for example, adjusts from 4 farads to 8, 16, 32 and 64 farads in order). Accordingly, the real center frequency $f_1$ of the filter circuit 10 is gradually decreased, and the real gain $gm_r$ of the filter circuit 10 is gradually increased. In the above-described example of practical application, as the capacitance of the at least one capacitor is gradually increased, the real center frequency $f_1$ are gradually decreased from 500 MHz to 300 MHz, and the real gain $gm_r$ at the predetermined center frequency $f_0$ is gradually increased from 0.75 to 1.5. Then, when the processor 104 obtains the result that the real gain $gm_r$ equals the target gain $gm_0$ (as shown in FIG. 2B), the processor 104 no longer adjusts the real time constant $\tau_1$ of the filter circuit 10. The capacitance of the at least one capacitor has the value that is required for the filter circuit 10 affected by the manufacturing process variation.

In other some embodiments, the processor 104 can adjust the capacitance of the at least one capacitor by a digital algorithm (e.g. binary search algorithm).

Figure 4:
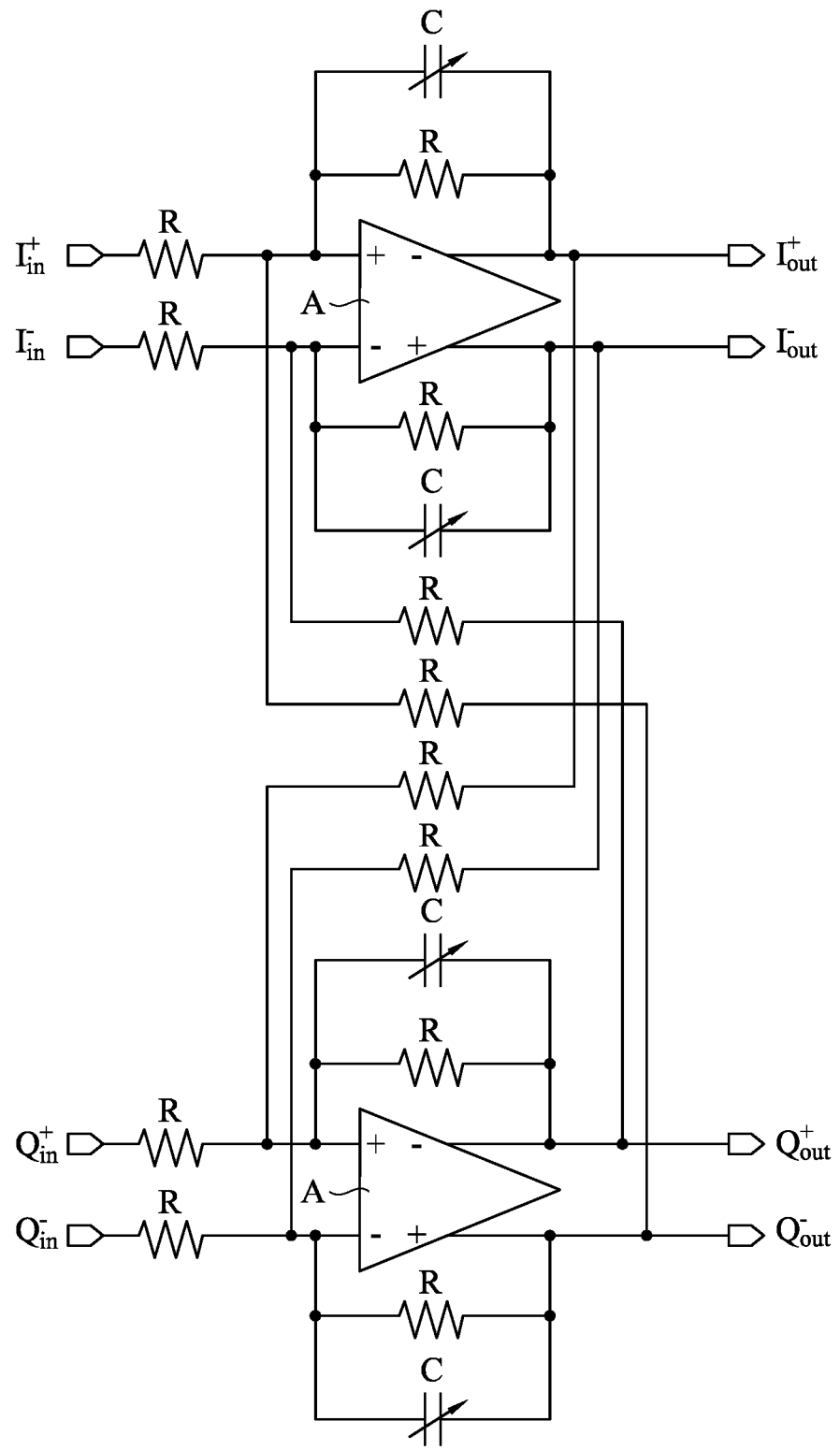
FIG. 4 is a schematic diagram of a filter circuit depicted according to some embodiments of the present disclosure.

Referring to FIG. 4, in other some embodiments, the filter circuit 10 can be a complex band-pass filter and includes a plurality of amplifiers A, a plurality of resistors R and a plurality of capacitors C. In the filter circuit 10 as shown in FIG. 4, the input signal $V_{IN}$ generated by the signal generator 102 includes a first differential input signal (including a first input signal $I_{in}^+$ and a second input signal $I_{in}^-$) and a second differential input signal (including a third input signal $Q_{in}^+$ and a fourth input signal $Q_{in}^-$~), wherein the first differential input signal and the second differential input signal have a 90 degrees difference in phase. In addition, the output signal $V_{OUT}$ outputted by the filter circuit 10 includes a first differential output signal (including a first output signal $I_{out}^+$ and a second output signal $I_{out}^-$) and a second differential output signal (including a third output signal $Q_{out}^+$ and a fourth output signal $Q_{out}^-$). The description that the calibration device 100 calibrates the filter circuit 10 as shown in FIG. 4 is similar to those of the above-described embodiments and therefore is omitted.

Figure 5:
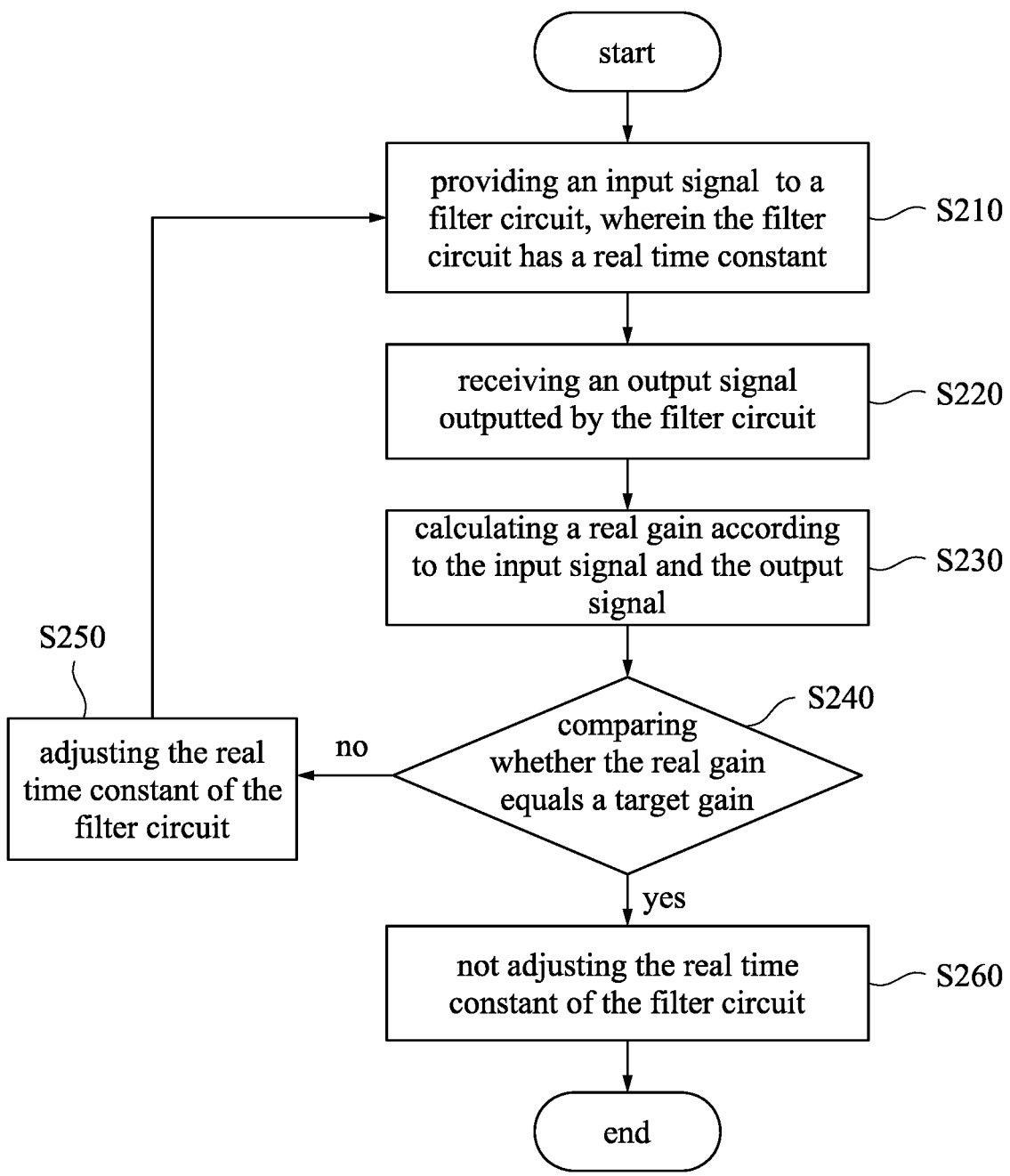
FIG. 5 is a flow diagram of a calibration method depicted according to some embodiments of the present disclosure.

Referring to FIG. 5, FIG. 5 depicts a flow diagram of the calibration method 200 in accordance with one embodiment of the present disclosure. The calibration method 200 can be executed by the calibration device 100 as shown in FIG. 1.

In the step S210, the input signal $V_{IN}$ is provided by the signal generator 102 to the filter circuit 10 affected by the manufacturing process variation, wherein the filter circuit 10 has a real time constant $\tau_1$. In the step S220, the output signal $V_{OUT}$ outputted by the filter circuit 10 is received by the processor 104. In the step S230, the real gain $gm_r$ is calculated by the processor 104 according to the input signal $V_{IN}$ and the output signal $V_{OUT}$.

In the steps S240-S260, the real gain $gm_r$ and the target gain $gm_0$ (that is, the maximum gain that the filter circuit 10 should have at the predetermined center frequency $f_0$ which is originally designed) are compared to obtain a comparison result, so as to determine whether to adjust the real time constant $\tau_1$ of the filter circuit 10 according to the comparison result. Specifically, in the step S240, the real gain $gm_r$ is compared with the target gain $gm_0$ to determine whether the real gain $gm_r$ equals the target gain $gm_0$. If the comparison result shows "no", the step S250 is executed so as to adjust the real time constant $\tau_1$ of the filter circuit 10.

After the real time constant $\tau_1$ of the filter circuit 10 is adjusted, the procedure returns to the step S210. The input signal $V_{IN}$ is provided to the filter circuit 10 which has been adjusted, so as to execute the steps S220-S240 again. In brief, if the result that the real gain $gm_r$ does not equal the target gain $gm_0$ is obtained in the step S240, the step S250 is executed to adjust the real time constant $\tau_1$ of the filter circuit 10, and the steps S210-S240 are executed again.

If the comparison result in the step S240 shows "yes", the step S260 is executed to not adjust the real time constant $\tau_1$ of the filter circuit 10 (at this time, the real time constant $\tau_1$ equals the predetermined time constant $\tau_0$, which is originally designed, of the filter circuit 10). Accordingly, the calibration method 200 is ended.

In sum, the calibration device 100 and the calibration method 200 of the present disclosure adjust the filter circuit 10 by comparing the real gain $gm_r$ of the filter circuit 10 with the target gain $gm_0$ directly, so as to compensate a variety of components (e.g. resistor, capacitor, operation amplifier) of the filter circuit 10 for the deviations generated by the manufacturing process variation. In such way, the filter circuit 10 can be calibrated to have the originally designed values (that is, the predetermined center frequency $f_0$, the predetermined time constant $\tau_0$ and the target gain $gm_0$), so as to facilitate the demodulation of signals.

Although the present disclosure has been described in considerable detail with reference to certain embodiments thereof, other embodiments are possible. Therefore, the spirit and scope of the appended claims should not be limited to the description of the embodiments contained herein. It will be apparent to those skilled in the art that various modifications and variations can be made to the structure of the present disclosure without departing from the scope or spirit of the invention. In view of the foregoing, it is intended that the present invention cover modifications and variations of this invention provided they fall within the scope of the following claims.

What is claimed is:

1. A calibration device, comprising:
   a signal generator configured to provide an input signal to a filter circuit, wherein the filter circuit has a real time constant caused by a manufacturing process variation of the filter circuit and is configured to receive the input signal to output an output signal; and
   a processor coupled to the signal generator and the filter circuit, configured to divide the output signal by the input signal to generate a ratio, configured to use an absolute value of the ratio as a real gain, configured to compare the real gain with a target gain to obtain a comparison result and configured to determine whether to adjust the real time constant of the filter circuit according to the comparison result,
   wherein the target gain is a maximum gain that the filter circuit ideally has at a predetermined center frequency of the filter circuit.

2. The calibration device of claim 1, wherein when the comparison result shows that the real gain does not equal the target gain, the processor adjusts the real time constant of the filter circuit.

3. The calibration device of claim 2, wherein the processor adjusts the real time constant of the filter circuit, so as to adjust the real gain.

4. The calibration device of claim 2, wherein the processor adjusts the capacitance of at least one capacitor of the filter circuit or the resistance of at least one resistor of the filter circuit through a binary search algorithm, so as to adjust the real time constant of the filter circuit.

5. The calibration device of claim 1, wherein when the comparison result shows that the real gain equals the target gain, the processor does not adjust the real time constant of the filter circuit.

6. The calibration device of claim 5, wherein the filter circuit have ideally has a predetermined time constant corresponding to the predetermined center frequency;
   when the comparison result shows that the real gain equals the target gain, the real time constant of the filter circuit equals the predetermined time constant.

7. The calibration device of claim 6, wherein a frequency of the input signal equals the predetermined center frequency of the filter circuit.

8. The calibration device of claim 1, wherein the filter circuit is a complex band-pass filter;
   the input signal comprises a first differential input signal and a second differential input signal with a 90 degrees difference in phase.

9. The calibration device of claim 1, wherein the signal generator comprises a crystal oscillator and a low-pass filter.

10. A calibration method, comprising:
    by a signal generator, providing an input signal to a filter circuit, wherein the filter circuit has a real time constant caused by a manufacturing process variation of the filter circuit;
    by a processor, receiving an output signal outputted by the filter circuit, wherein the processor is coupled to the signal generator and the filter circuit;

by the processor, dividing the output signal by the input signal to generate a ratio;

by the processor, using an absolute value of the ratio as a real gain;

by the processor, comparing the real gain with a target gain to obtain a comparison result, wherein the target gain is a maximum gain that the filter circuit ideally has at a predetermined center frequency of the filter circuit; and by the processor, determining whether to adjust the real time constant of the filter circuit according to the comparison result.

11. The calibration method of claim 10, wherein the step of determining whether to adjust the real time constant of the filter circuit according to the comparison result comprises:

when the comparison result shows that the real gain does not equal the target gain, adjusting the real time constant of the filter circuit.

12. The calibration method of claim 11, wherein the real time constant of the filter circuit is adjusted, so as to adjust the real gain.

13. The calibration method of claim 11, wherein the step of adjusting the real time constant of the filter circuit comprises:

adjusting the capacitance of at least one capacitor of the filter circuit or the resistance of at least one resistor of the filter circuit through a binary search algorithm.

14. The calibration method of claim 10, wherein the step of determining whether to adjust the real time constant of the filter circuit according to the comparison result comprises:

when the comparison result shows that the real gain equals the target gain, not adjusting the real time constant of the filter circuit.

15. The calibration method of claim 14, wherein the filter circuit ideally has a predetermined time constant corresponding to the predetermined center frequency;

when the comparison result shows that the real gain equals the target gain, the real time constant of the filter circuit equals the predetermined time constant.

16. The calibration method of claim 15, wherein a frequency of the input signal equals the predetermined center frequency of the filter circuit.

17. The calibration method of claim 10, wherein the filter circuit is a complex band-pass filter.

18. The calibration method of claim 17, wherein the input signal comprises a first differential input signal and a second differential input signal with a 90 degrees difference in phase.

* * * * *